United States Patent
Li et al.

(10) Patent No.: US 10,991,768 B2
(45) Date of Patent: Apr. 27, 2021

(54) PIXEL ARRANGEMENT, MANUFACTURING METHOD THEREOF, DISPLAY PANEL, DISPLAY DEVICE, AND MASK

(71) Applicant: BOE TECHNOLOGY GROUP CO., LTD., Beijing (CN)

(72) Inventors: Yansong Li, Beijing (CN); Haidong Wu, Beijing (CN); Shanshan Bai, Beijing (CN); Zhihui Xiao, Beijing (CN); Yue Liu, Beijing (CN); Haohan Zhang, Beijing (CN); Yangpeng Wang, Beijing (CN)

(73) Assignee: BOE TECHNOLOGY GROUP CO., LTD., Bejing (CN)

( * ) Notice: Subject to any disclaimer, the term of this patent is extended or adjusted under 35 U.S.C. 154(b) by 157 days.

(21) Appl. No.: 16/468,611

(22) PCT Filed: Dec. 20, 2018

(86) PCT No.: PCT/CN2018/122206
§ 371 (c)(1),
(2) Date: Jun. 11, 2019

(87) PCT Pub. No.: WO2019/134522
PCT Pub. Date: Jul. 11, 2019

(65) Prior Publication Data
US 2020/0343318 A1    Oct. 29, 2020

(30) Foreign Application Priority Data

Jan. 2, 2018  (CN) .......................... 201810002739.4
Feb. 9, 2018  (CN) .......................... 201810134096.9

(51) Int. Cl.
*H01L 27/32* (2006.01)
*H01L 51/00* (2006.01)

(52) U.S. Cl.
CPC ...... *H01L 27/3218* (2013.01); *H01L 27/3216* (2013.01); *H01L 51/0011* (2013.01)

(58) Field of Classification Search
None
See application file for complete search history.

(56) References Cited

U.S. PATENT DOCUMENTS

| 2013/0234917 | A1  | 9/2013 | Lee |
| 2014/0071030 | A1* | 3/2014 | Lee ..................... H01L 27/3218 345/82 |

(Continued)

FOREIGN PATENT DOCUMENTS

| CN | 103311266 A | 9/2013 |
| CN | 103941490 A | 7/2014 |

(Continued)

OTHER PUBLICATIONS

International Search Report and Written Opinion of the International Searching Authority (with English language translation), International Application No. PCT/CN2018/122206, dated Mar. 25, 2019, 11 pp.

(Continued)

*Primary Examiner* — J. E. Schoenholtz
(74) *Attorney, Agent, or Firm* — Myers Bigel, P.A.

(57) ABSTRACT

A pixel arrangement including first groups of sub-pixels arranged in a first direction, each of the first groups including first sub-pixels and third sub-pixels arranged alternately and second groups of sub-pixels arranged in the first direction, each of the second groups including third sub-pixels and second sub-pixels arranged alternately. The first groups and the second groups are alternately arranged in a second direction intersecting the first direction. The first groups and the second groups are arranged to form third groups of sub-pixels arranged in the second direction and fourth groups of sub-pixels arranged in the second direction. The (Continued)

third groups and the fourth groups are alternately arranged in the first direction. Each of the third groups includes first sub-pixels and third sub-pixels arranged alternately. Each of the fourth groups includes third sub-pixels and second sub-pixels arranged alternately.

20 Claims, 9 Drawing Sheets

(56) References Cited

U.S. PATENT DOCUMENTS

| | | | |
|---|---|---|---|
| 2015/0109268 | A1 | 4/2015 | Huang et al. |
| 2015/0162391 | A1 | 6/2015 | Kim |
| 2016/0253943 | A1 | 9/2016 | Wang |
| 2017/0287988 | A1 | 10/2017 | Lee et al. |
| 2017/0294491 | A1 | 10/2017 | Jo et al. |
| 2017/0309688 | A1 | 10/2017 | Lee et al. |
| 2018/0357953 | A1 | 12/2018 | Hu |
| 2018/0366052 | A1 | 12/2018 | Shi |
| 2019/0035861 | A1* | 1/2019 | Wang ................ H01L 27/32 |
| 2019/0252469 | A1* | 8/2019 | Xiao ................ H01L 27/3216 |
| 2020/0357322 | A1* | 11/2020 | Wu ................ H01L 27/3218 |

FOREIGN PATENT DOCUMENTS

| | | |
|---|---|---|
| CN | 104282727 A | 1/2015 |
| CN | 104701341 A | 6/2015 |
| CN | 105826349 A | 8/2016 |
| CN | 106298851 A | 1/2017 |
| CN | 106486513 A | 3/2017 |
| CN | 106920832 A | 7/2017 |
| CN | 107248378 A | 10/2017 |
| CN | 107275359 A | 10/2017 |
| CN | 107275360 A | 10/2017 |
| CN | 107305905 A | 10/2017 |
| CN | 207966985 U | 10/2018 |
| CN | 207966994 U | 10/2018 |
| CN | 207966995 U | 10/2018 |
| KR | 1020170116598 A | 10/2017 |

OTHER PUBLICATIONS

First Review Notice and English language translation, CN Application No. 201820241941.8, dated Jul. 23, 2018, 5 pp.

International Search Report and Written Opinion of the International Searching Authority (with English language translation), International Application No. PCT/CN2018/122021, dated Feb. 27, 2019, 11 pp.

International Search Report and Written Opinion of the International Searching Authority (with English language translation), International Application No. PCT/CN2018/122205, dated Feb. 27, 2019, 14 pp.

International Search Report and Written Opinion of the International Searching Authority (with English language translation), International Application No. PCT/CN2018/122063, dated Mar. 18, 2019, 13 pp.

International Search Report and Written Opinion of the International Searching Authority (with English language translation), International Application No. PCT/CN2018/122022, dated Mar. 26, 2019, 11 pp.

* cited by examiner

900A

900B

900C

PIXEL ARRANGEMENT, MANUFACTURING METHOD THEREOF, DISPLAY PANEL, DISPLAY DEVICE, AND MASK

CROSS-REFERENCE TO RELATED APPLICATIONS

The present application is a 35 U.S.C. 371 national stage application of PCT International Application No. PCT/CN2018/122206, filed on Dec. 20, 2018, which claims priority to Chinese Patent Application No. 201810002739.4 filed on Jan. 2, 2018 and to Chinese Patent Application No. 201810134096.9 filed on Feb. 9, 2018, the entire disclosures of which are incorporated herein by reference.

TECHNICAL FIELD

The present disclosure relates to the field of display technologies, and in particular, to a pixel arrangement, a method of manufacturing the pixel arrangement, a display panel, a display device, and a mask.

BACKGROUND

Organic electroluminescent (OLED) displays have advantages such as low energy consumption, low production cost, self-illumination, wide view angle and fast responsiveness, as compared with liquid crystal displays (LCDs). OLED display devices have currently begun to replace traditional liquid crystal displays in the field of flat panel display such as mobile phones, PDAs, and digital cameras.

An OLED display typically includes a base substrate and sub-pixels on the base substrate that are arranged in a matrix. The sub-pixels are generally formed by evaporating organic light-emitting materials on an array substrate using a fine metal mask (FMM).

SUMMARY

According to some embodiments of the present disclosure, a pixel arrangement is provided, comprising: a plurality of first groups of sub-pixels arranged in a first direction, each of the plurality of first groups comprising a plurality of first sub-pixels and a plurality of third sub-pixels arranged alternately; and a plurality of second groups of sub-pixels arranged in the first direction, each of the plurality of second groups comprising a plurality of third sub-pixels and a plurality of second sub-pixels arranged alternately. The plurality of first groups and the plurality of second groups are alternately arranged in a second direction intersecting the first direction. The plurality of first groups and the plurality of second groups are arranged to form a plurality of third groups of sub-pixels arranged in the second direction and a plurality of fourth groups of sub-pixels arranged in the second direction, the plurality of third groups and the plurality of fourth groups are alternately arranged in the first direction, each of the plurality of third groups comprises a plurality of first sub-pixels and a plurality of third sub-pixels arranged alternately, and each of the plurality of fourth groups comprises a plurality of third sub-pixels and a plurality of second sub-pixels arranged alternately. Each of the third sub-pixels in each first group of the plurality of first groups has a first minimum distance from one of two first sub-pixels, directly adjacent thereto, of the first sub-pixels in the first group and a second minimum distance from another of the two first sub-pixels, directly adjacent thereto, of the first sub-pixels in the first group, the first minimum distance being not equal to the second minimum distance. Alternatively or additionally, each of the third sub-pixels in each second group of the plurality of second groups has a third minimum distance from one of two second sub-pixels, directly adjacent thereto, of the second sub-pixels in the second group and a fourth minimum distance from another of the two second sub-pixels, directly adjacent thereto, of the second sub-pixels in the second group, the third minimum distance being not equal to the fourth minimum distance.

In some embodiments, each of the third sub-pixels in each third group of the plurality of third groups has the first minimum distance from one of two first sub-pixels, directly adjacent thereto, of the first sub-pixels in the third group and the second minimum distance from another of the two first sub-pixels, directly adjacent thereto, of the first sub-pixels in the third group. Alternatively or additionally, each of the third sub-pixels in each fourth group of the plurality of fourth groups has the third minimum distance from one of two second sub-pixels, directly adjacent thereto, of the second sub-pixels in the fourth group and the fourth minimum distance from another of the two second sub-pixels, directly adjacent thereto, of the second sub-pixels in the fourth group.

In some embodiments, the first minimum distance is substantially equal to the third minimum distance.

In some embodiments, the second minimum distance is substantially equal to the fourth minimum distance.

In some embodiments, the third sub-pixels each have an irregular shape.

In some embodiments, the third sub-pixels each have substantially a same area.

In some embodiments, the third sub-pixels in each of the plurality of first groups each have a length direction substantially parallel to the first direction, and the third sub-pixels in each of the plurality of second groups each have a length direction substantially parallel to the second direction.

In some embodiments, each two adjacent ones of the third sub-pixels in each of the plurality of first groups are rotationally symmetric with respect to a midpoint of an imaginary line connecting geometric centers of the two adjacent ones of the third sub-pixels, and each two adjacent ones of the third sub-pixels in each of the plurality of third groups are rotationally symmetric with respect to a midpoint of an imaginary line connecting geometric centers of the two adjacent ones of the third sub-pixels.

In some embodiments, the first sub-pixels and the second sub-pixels each have a regular shape.

In some embodiments, first ones of the first sub-pixels each have a first shape and second ones of the first sub-pixels each have a second shape different from the first shape.

In some embodiments, first ones of the second sub-pixels each have a first shape and second ones of the second sub-pixels each have a second shape different from the first shape.

In some embodiments, the first sub-pixels each have substantially a same area, and the second sub-pixels each have substantially a same area.

In some embodiments, the first sub-pixels are red sub-pixels, the second sub-pixels are blue sub-pixels, and the third sub-pixels are green sub-pixels.

In some embodiments, the first sub-pixels are blue sub-pixels, the second sub-pixels are red sub-pixels, and the third sub-pixels are green sub-pixels.

In some embodiments, the first sub-pixels each have a first area, the second sub-pixels each have a second area, and the third sub-pixels each have a third area that is smaller than the first area and the second area.

According to some embodiments of the present disclosure, a display panel is provided, comprising: a display substrate; and the pixel arrangement as described above, the pixel arrangement formed on the display substrate. The pixel arrangement is arranged such that each of the first direction and the second direction intersects a length direction of the display substrate at approximately 45 degrees.

In some embodiments, the first sub-pixels, the second sub-pixels, and the third sub-pixels are organic electroluminescent sub-pixels.

According to some embodiments of the present disclosure, a display device is provided, comprising the display panel as described above.

According to some embodiments of the present disclosure, a set of masks for manufacturing the pixel arrangement as described above is provided, comprising: a first mask defining a plurality of first openings arranged to have a pattern corresponding to a pattern of the first sub-pixels; a second mask defining a plurality of second openings arranged to have a pattern corresponding to a pattern of the second sub-pixels; and a third mask defining a plurality of third openings arranged to have a pattern corresponding to a pattern of the third sub-pixels.

According to some embodiments of the present disclosure, a method of manufacturing a pixel arrangement using the set of masks as described above is provided, comprising: providing a display substrate; evaporating a first electroluminescent material and depositing the evaporated first electroluminescent material onto the display substrate to form the first sub-pixels by passing the evaporated first electroluminescent material through the plurality of first openings of the first mask; evaporating a second electroluminescent material and depositing the evaporated second electroluminescent material onto the display substrate to form the second sub-pixels by passing the evaporated second electroluminescent material through the plurality of second openings of the second mask; and evaporating a third electroluminescent material and depositing the evaporated third electroluminescent material onto the display substrate to form the third sub-pixels by passing the evaporated third electroluminescent material through the plurality of third openings of the third mask.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

In the figures, different reference signs, combined by the same numeral and different letter suffixes, can be collectively referenced by that numeral.

DETAILED DESCRIPTION

Figure 1:
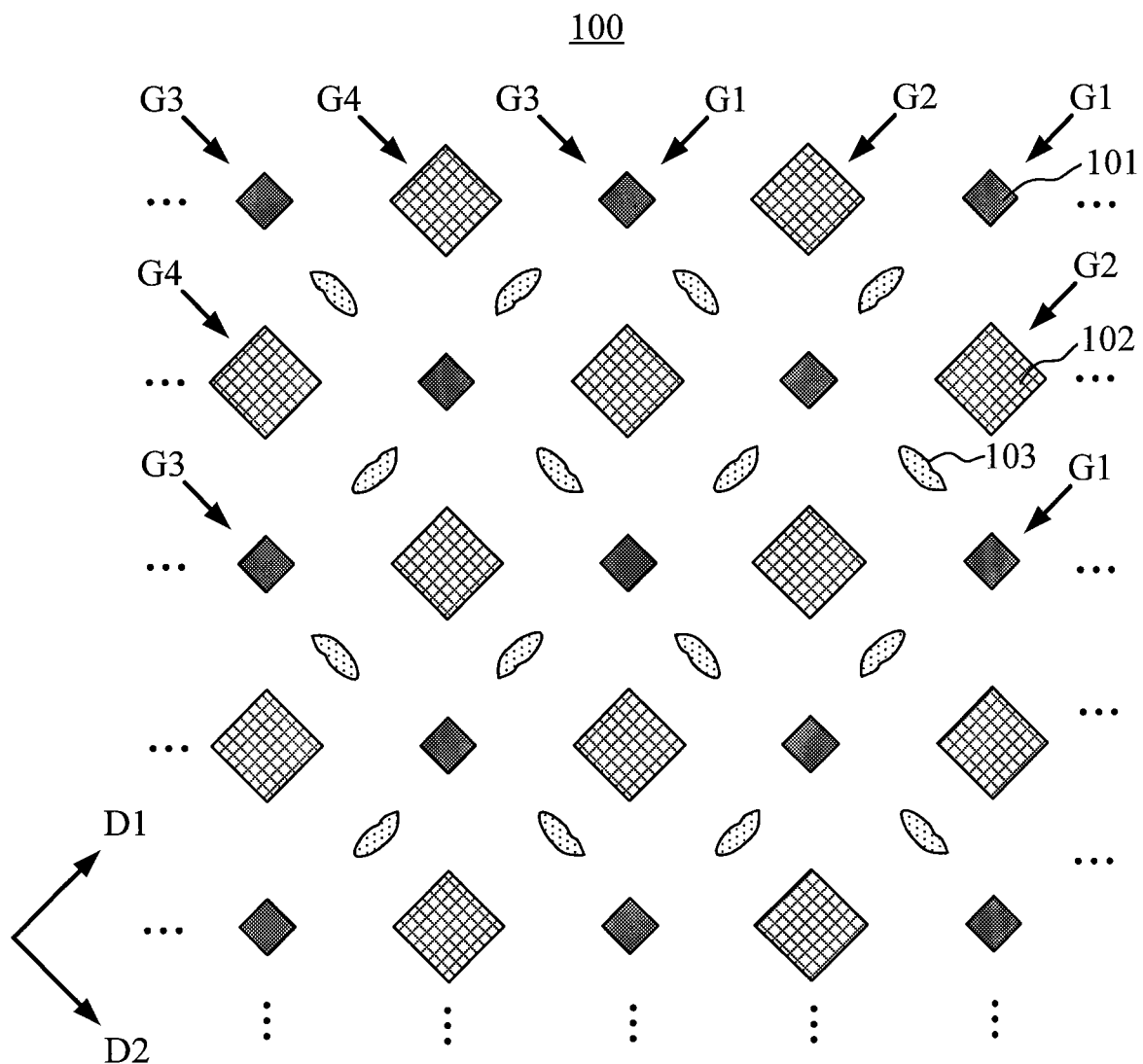
FIG. 1 is a schematic plan view of a pixel arrangement according to an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the FIGS. are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

FIG. 1 is a schematic plan view of a pixel arrangement 100 according to an embodiment of the present disclosure.

As shown in FIG. 1, the pixel arrangement 100 includes a plurality of first groups of sub-pixels G1 arranged in a first direction D1 and a plurality of second groups of sub-pixels G2 arranged in the first direction D1. The plurality of first groups G1 and the plurality of second groups G2 are alternately arranged in a second direction D2 intersecting (e.g., perpendicular to) the first direction D1.

Each of the plurality of first groups G1 includes a plurality of first sub-pixels 101 and a plurality of third sub-pixels 103 that are alternately arranged. Each of the plurality of second groups G2 includes a plurality of third sub-pixels 103 and a plurality of second sub-pixels 102 that are alternately arranged. The plurality of first groups G1 and the plurality of second groups G2 are further arranged to form a plurality of third groups of sub-pixels G3 arranged in the second direction D2 and a plurality of fourth groups of sub-pixels G4 arranged in the second direction D2. The plurality of third groups G3 and the plurality of fourth groups G4 are alternately arranged in the first direction D1. Each of the plurality of third groups G3 includes a plurality of first sub-pixels 101 and a plurality of third sub-pixels 103 that are alternately arranged, and each of the plurality of fourth groups G4 includes a plurality of third sub-pixels 103 and a plurality of second sub-pixels 102 that are alternately arranged.

Figure 2:
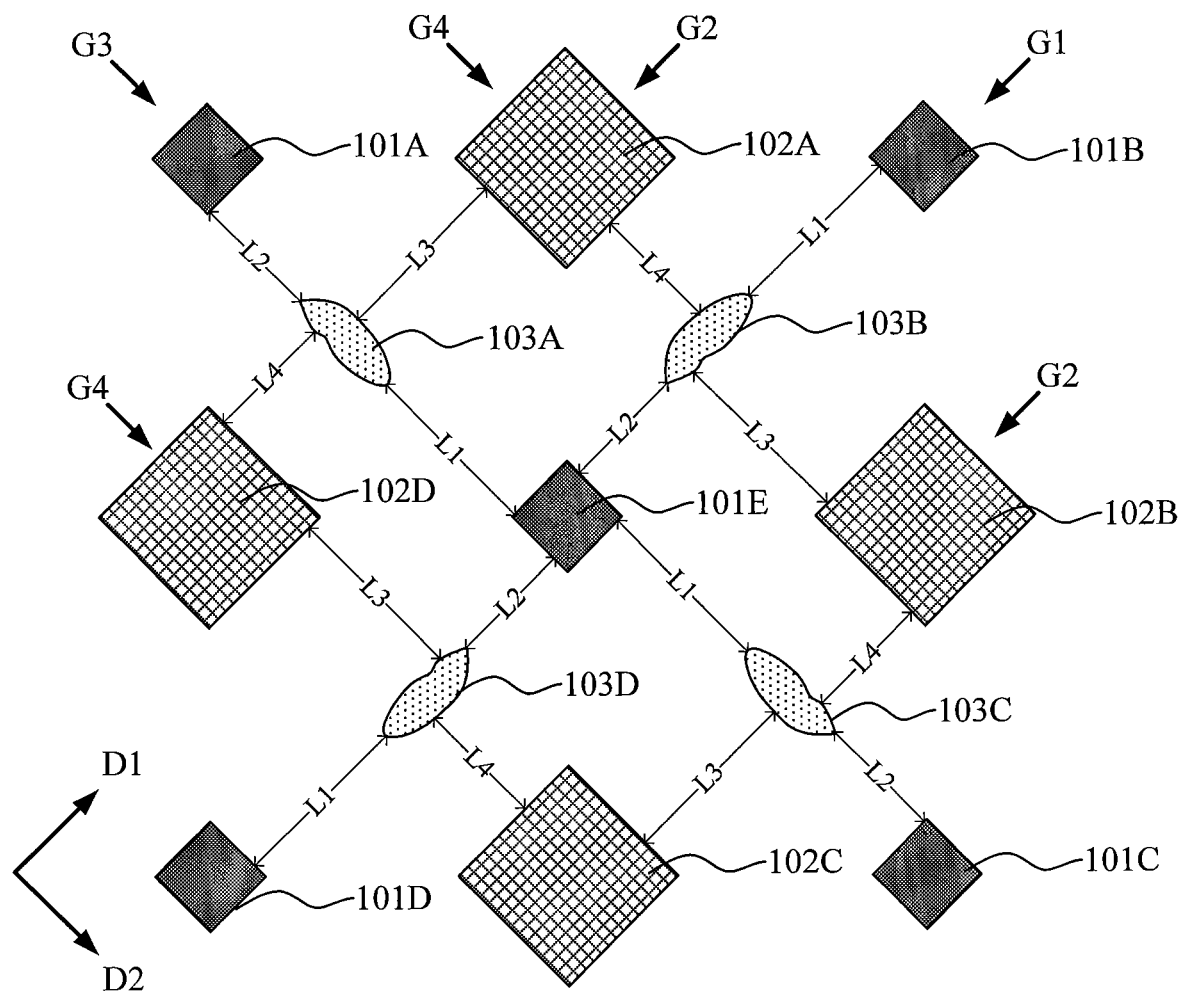
FIG. 2 is a schematic plan view of a partial area of the pixel arrangement of FIG. 1.

FIG. 2 is a schematic plan view of a partial area of the pixel arrangement 100 of FIG. 1.

In this embodiment, each of the third sub-pixels 103 in each first group of the plurality of first groups G1 has a first minimum distance from one of two first sub-pixels, directly adjacent thereto, of the first sub-pixels 101 in that first group G1 and a second minimum distance from the other of the two first sub-pixels, directly adjacent thereto, of the first sub-pixels 101 in that first group G1, with the first minimum distance being not equal to the second minimum distance. In the example of FIG. 2, the third sub-pixel 103B has a first minimum distance L1 from the first sub-pixel 101B and a second minimum distance L2 from the first sub-pixel 101E. The first minimum distance L1 is not equal to (greater than in this example) the second minimum distance L2. Similarly, the third sub-pixel 103D has a first minimum distance L1 from the first sub-pixel 101D and a second minimum distance L2 from the first sub-pixel 101E.

Alternatively or additionally, each of the third sub-pixels 103 in each second group of the plurality of second groups G2 has a third minimum distance from one of two second sub-pixels, directly adjacent thereto, of the second sub-pixels 102 in that second group G2 and a fourth minimum distance from the other of the two second sub-pixels, directly adjacent thereto, of the second sub-pixels 102 in that second group G2, with the third minimum distance being not equal to the fourth minimum distance. In the example of FIG. 2, the third sub-pixel 103A has a third minimum distance L3 from the second sub-pixel 102A and a fourth minimum distance L4 from the second sub-pixel 102D. The third minimum distance L3 is not equal to (greater than in this example) the fourth minimum distance L4. Similarly, the third sub-pixel 103C has a third minimum distance L3 from the second sub-pixel 102C and a fourth minimum distance L4 from the second sub-pixel 102B.

It will be understood that a minimum distance between two sub-pixels refers to the shortest one of the distances from any point of one of the two sub-pixels to any point of the other of the two sub-pixels. The minimum distance has to be greater than or equal to a process limit distance. The process limit distance is generally related to the manufacturing process used. In embodiments where a fine metal mask (FMM) is used in conjunction with an etching process, the process limit distance is about 16 µm. In embodiments where a process such as lasering or electroforming is used, the process limit distance may be even smaller.

The pixel arrangement 100 may allow the first sub-pixels 101, the second sub-pixels 102, and the third sub-pixels 103 to be more closely arranged under the same process condition compared with the existing pixel arrangement, thereby increasing as much as possible the area of every single sub-pixel. This in turn facilitates reduction of the drive current of the display device and an increase in the lifetime of the display device.

With continued reference to FIG. 2, in this embodiment, each of the third sub-pixels 103 in each third group of the plurality of third groups G3 has the first minimum distance from one of two first sub-pixels, directly adjacent thereto, of the first sub-pixels 101 in that third group G3 and the second minimum distance from the other of the two first sub-pixels, directly adjacent thereto, of the first sub-pixels 101 in that third group G3. In the example of FIG. 2, the third sub-pixel 103A has the first minimum distance L1 from the first sub-pixel 101E and the second minimum distance L2 from the first sub-pixel 101A. Similarly, the third sub-pixel 103C has the first minimum distance L1 from the first sub-pixel 101E and the second minimum distance L2 from the first sub-pixel 101C.

Alternatively or additionally, each of the third sub-pixels 103 in each fourth group of the plurality of fourth groups G4 has the third minimum distance from one of two second sub-pixels, directly adjacent thereto, of the second sub-pixels 102 in that fourth group G4 and the fourth minimum distance from the other of the two second sub-pixels, directly adjacent thereto, of the second sub-pixels 102 in that fourth group G4. In the example of FIG. 2, the third sub-pixel 103B has the third minimum distance L3 from the second sub-pixel 102B and the fourth minimum distance L4 from the second sub-pixel 102A. Similarly, the third sub-pixel 103D has the third minimum distance L3 from the second sub-pixel 102D and the fourth minimum distance L4 from the second sub-pixel 102C.

This provides a relatively uniform distribution of the third sub-pixels 103 in the first and third groups G1 and G3 as well as a relatively uniform distribution in the second and fourth groups G2 and G4, which is advantageous for achieving a desired display effect.

In some embodiments, the first minimum distance L1 may be substantially equal to the third minimum distance L3. Alternatively or additionally, the second minimum distance L2 may be substantially equal to the fourth minimum distance L4. This further provides a specific sub-pixel pattern that facilitates the desired display effect. It will be understood that in this document the term "substantially" used in connection with "equivalent," "parallel," etc., is intended to encompass variations due to the manufacturing process.

In the example of FIG. 2, the third sub-pixels 103 are illustrated as having the same irregular shape, and the first sub-pixels 101 and the second sub-pixels 102 are illustrated as having regular (specifically, rectangular) shapes. Further, the third sub-pixels 103 may have substantially the same area. Other embodiments are possible.

Figure 3:
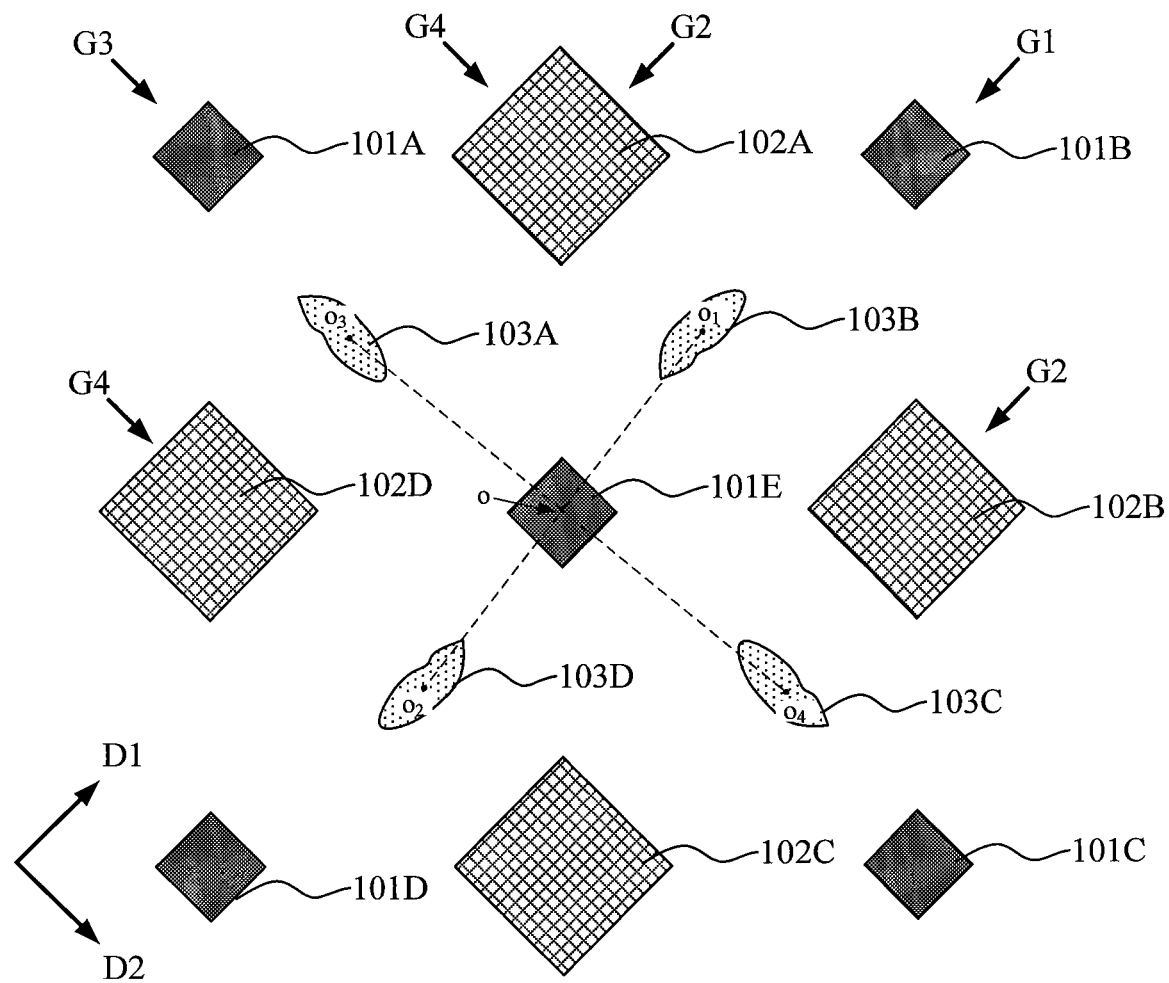
FIG. 3 is a schematic plan view of a partial area of the pixel arrangement of FIG. 1.

FIG. 3 more clearly shows the arrangement of the first sub-pixels 101, the second sub-pixels 102, and the third sub-pixels 103 by omitting the lines indicating the first, second, third, and fourth minimum distances L1, L2, L3, and L4 in FIG. 2.

In this embodiment, the third sub-pixels 103 in each of the plurality of first groups G1 may each have a length direction substantially parallel to the first direction D1, and the third sub-pixels 103 in each of the plurality of second groups G2 may each have a length direction substantially parallel to the second direction D2. In the example of FIG. 3, the third sub-pixels 103B and 103D each have a length direction substantially parallel to the first direction D1, and the third sub-pixels 103A and 103C each have a length direction substantially parallel to the second direction D2.

In this embodiment, every two adjacent ones of the third sub-pixels 103 in each of the plurality of first groups G1 may be rotationally symmetric with respect to a midpoint of an imaginary line connecting geometric centers of those two adjacent third sub-pixels 103, and every two adjacent ones of the third sub-pixels 103 in each of the plurality of third groups G3 may be rotationally symmetric with respect to a midpoint of an imaginary line connecting geometric centers of those two adjacent third sub-pixels 103. In the example of FIG. 3, the two third sub-pixels 103B and 103D adjacent in the first direction D1 are rotationally symmetric with respect to a midpoint o of a first imaginary line (indicated by a dashed line) connecting the geometric centers $o_1$ and $o_2$ of these two adjacent third sub-pixels 103B and 103D, and the two third sub-pixels 103A and 103C adjacent in the second direction D2 are rotationally symmetric with respect to a midpoint o of a second imaginary line (indicated by a dashed line) connecting the geometric centers $o_3$ and $o_4$ of these two adjacent third sub-pixels 103A and 103C. In this example, the midpoint of the first imaginary line coincides exactly with the midpoint of the second imaginary line (point o), although this may not be the case in other embodiments.

Figure 4:
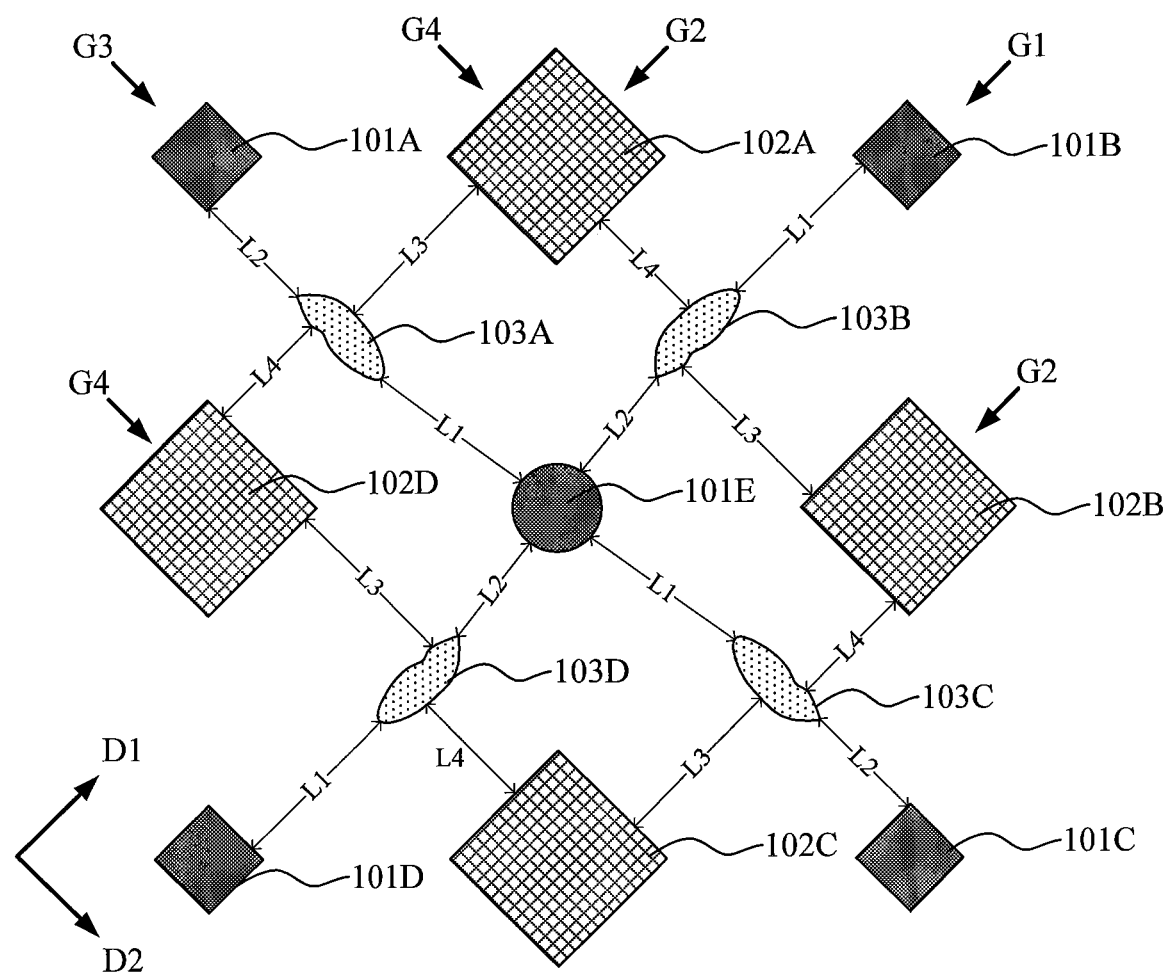
FIG. 4 is a schematic plan view of a partial area of a variation of the pixel arrangement of FIG. 1.

FIG. 4 is a schematic plan view of a partial area of a variation of the pixel arrangement 100 of FIG. 1, in which a variation in shape of the first sub-pixels 101 is shown. This provides a specific sub-pixel pattern that facilitates the desired display.

In this embodiment, first ones of the first sub-pixels 101 each have a first shape and second ones of the first sub-pixels 101 each have a second shape different from the first shape. In the example of FIG. 4, the first sub-pixels 101A, 101B, 101C and 101D each have a rectangular shape, and the first sub-pixel 101E has a circular shape. Each of the first sub-pixels 101A, 101B, 101C and 101D may or may not have the same area as the first sub-pixel 101E.

Similar to the embodiment of FIG. 2, the third sub-pixel 103B has the first minimum distance L1 from the first sub-pixel 101B and the second minimum distance L2 from the first sub-pixel 101E, and the third sub-pixel 103D has the first minimum distance L1 from the first sub-pixel 101D and the second minimum distance L2 from the first sub-pixel 101E. Further, the third sub-pixel 103A has the third minimum distance L3 from the second sub-pixel 102A and the fourth minimum distance L4 from the second sub-pixel 102D, and the third sub-pixel 103C has the third minimum distance L3 from the second sub-pixel 102C and the fourth minimum distance L4 from the second sub-pixel 102B.

Similar to the embodiment of FIG. 2, the third sub-pixel 103A has the first minimum distance L1 from the first sub-pixel 101E and the second minimum distance L2 from the first sub-pixel 101A, and the third sub-pixel 103C has the first minimum distance L1 from the first sub-pixel 101E and the second minimum distance L2 from the first sub-pixel 101C. Further, the third sub-pixel 103B has the third minimum distance L3 from the second sub-pixel 102B and the fourth minimum distance L4 from the second sub-pixel 102A, and the third sub-pixel 103D has the third minimum distance L3 from the second sub-pixel 102D and the fourth minimum distance L4 from the second sub-pixel 102C.

Figure 5:
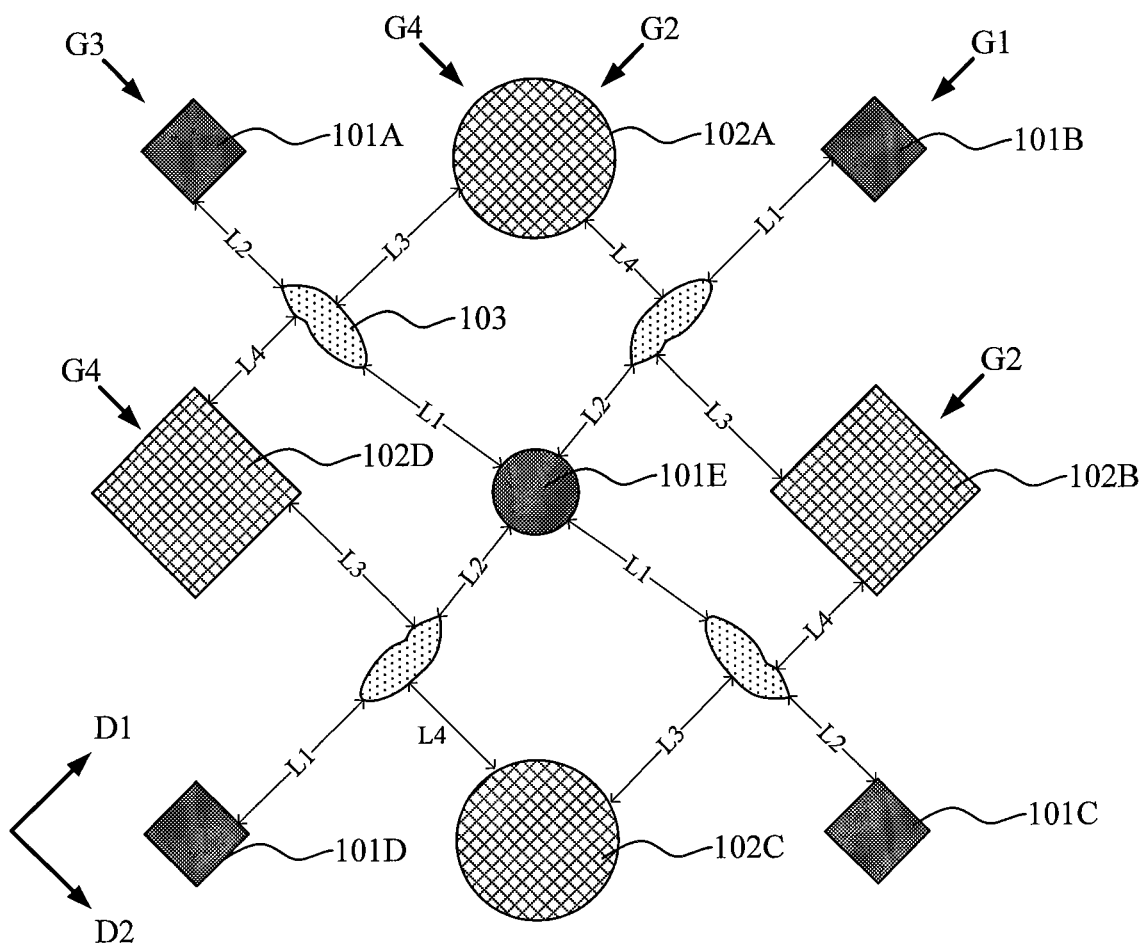
FIG. 5 is a schematic plan view of a partial area of another variation of the pixel arrangement of FIG. 1.

FIG. 5 is a schematic plan view of a partial area of another variation of the pixel arrangement 100 of FIG. 1, in which a variation in shape of the first sub-pixels 101 and the second sub-pixels 102 is shown. This provides a specific sub-pixel pattern that facilitates the desired display.

Similar to the example of FIG. 4, the first sub-pixels 101A, 101B, 101C and 101D each have a rectangular shape in this example, and the first sub-pixel 101E has a circular shape. Each of the first sub-pixels 101A, 101B, 101C and 101D may or may not have the same area as the first sub-pixel 101E.

In this embodiment, first ones of the second sub-pixels 102 each have a first shape and second ones of the second sub-pixels 102 each have a second shape different from the first shape. In the example of FIG. 5, the second sub-pixels 102A and 102C each have a circular shape, and the second sub-pixels 102B and 102D each have a rectangular shape. Each of the second sub-pixels 102A and 102C may or may not have the same area as each of the second sub-pixels 102B and 102D.

Similar to the embodiment of FIG. 4, the third sub-pixel 103B has the first minimum distance L1 from the first sub-pixel 101B and the second minimum distance L2 from the first sub-pixel 101E, and the third sub-pixel 103D has the first minimum distance L1 from the first sub-pixel 101D and the second minimum distance L2 from the first sub-pixel 101E. Further, the third sub-pixel 103A has the third minimum distance L3 from the second sub-pixel 102A and the fourth minimum distance L4 from the second sub-pixel 102D, and the third sub-pixel 103C has the third minimum distance L3 from the second sub-pixel 102C and the fourth minimum distance L4 from the second sub-pixel 102B.

Similar to the embodiment of FIG. 4, the third sub-pixel 103A has the first minimum distance L1 from the first sub-pixel 101E and the second minimum distance L2 from the first sub-pixel 101A, and the third sub-pixel 103C has the first minimum distance L1 from the first sub-pixel 101E and the second minimum distance L2 from the first sub-pixel 101C. Further, the third sub-pixel 103B has the third minimum distance L3 from the second sub-pixel 102B and the fourth minimum distance L4 from the second sub-pixel 102A, and the third sub-pixel 103D has the third minimum distance L3 from the second sub-pixel 102D and the fourth minimum distance L4 from the second sub-pixel 102C.

Although exemplary arrangements of the first sub-pixels 101, the second sub-pixels 102, and the third sub-pixels 103 are described above in connection with FIGS. 1-5, the present disclosure is not limited thereto. For example, the first sub-pixels 101 and the second sub-pixels 102 may have at least one shape selected from the group consisting of a rectangle, an ellipse, a convex polygon, a concave polygon, a triangle, and a circle. Other irregular shapes are also possible. In practice, the shape, area, orientation, and relative position of the first sub-pixels 101, the second sub-pixels 102, and the third sub-pixels 103 can be designed as needed.

Figure 6:
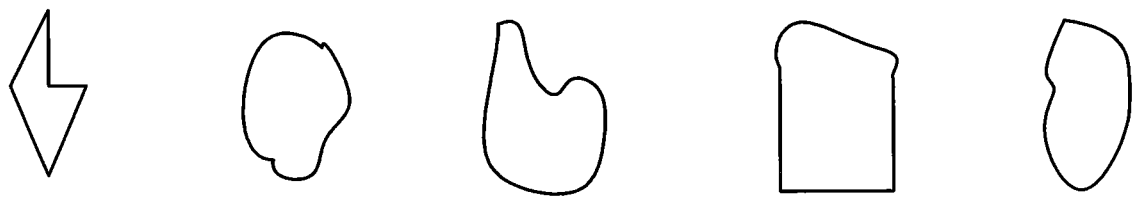
FIG. 6 is a schematic diagram of various variations of the third sub-pixel in shape.

FIG. 6 shows various variations in shape of the third sub-pixel 103.

As shown in FIG. 6, the third sub-pixel 103 may be of various irregular shapes different from regular shapes such as a triangle, a quadrangle, a pentagon, a hexagon, a diamond, a circle, an ellipse, and the like. The irregular shapes may be either symmetrical or asymmetrical. In some embodiments, at least a part of the outline of the irregular shape may be curved, such as comprised of a curve and a straight line. In some embodiments, the third sub-pixel 103 can also be of a regular shape. In some embodiments, the third sub-pixels 103 may or may not have the same shape.

In the embodiments described above, the third sub-pixels 103 may be green sub-pixels. In some embodiments, the first sub-pixels 101 may be red sub-pixels and the second sub-pixels 102 may be blue sub-pixels. Alternatively, the first sub-pixels 101 may be blue sub-pixels, and the second sub-pixels 102 may be red sub-pixels. Since the human eye is sensitive to green light, the area of the third sub-pixel 103 may be smaller than the area of the first sub-pixel 101 and may be smaller than the area of the second sub-pixel 102. That is, the area of the green sub-pixel is smaller than the area of the red sub-pixel and smaller than the area of the blue sub-pixel.

In embodiments, the second sub-pixel 102 and the first sub-pixel 101 may have the same area, namely, the red sub-pixel and the blue sub-pixel have the same area. Alternatively, the second sub-pixel 102 may have an area different from the area of the first sub-pixel 101, namely, the red sub-pixel has an area different from the area of the blue sub-pixel. In general, the area of the blue sub-pixel may be larger than the area of the red sub-pixel because the blue sub-pixel has lower luminous efficiency and lifetime than the red sub-pixel.

Figure 7:
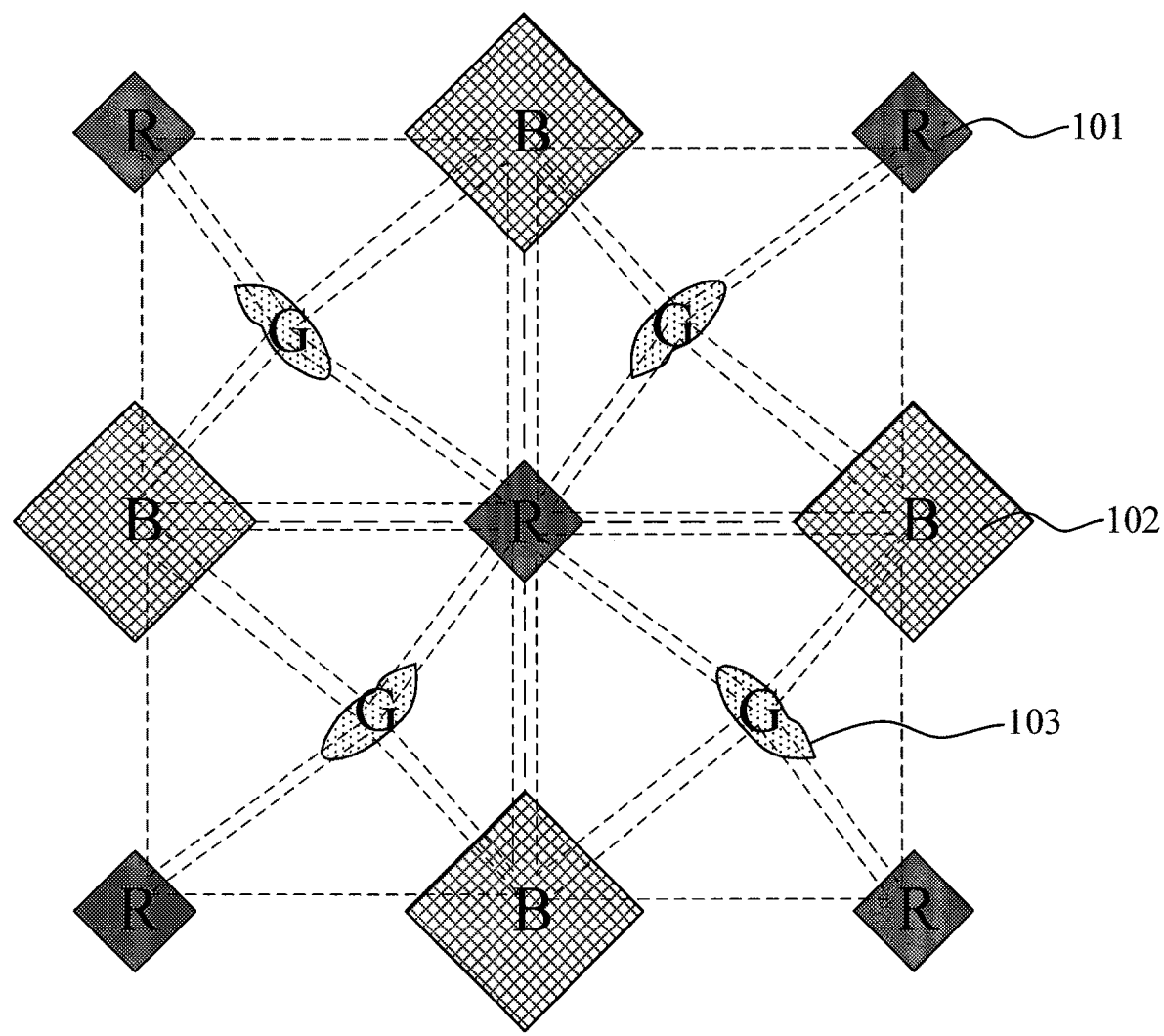
FIG. 7 is a schematic diagram generally showing a principle of color-borrowing of a pixel arrangement according to an embodiment of the present disclosure.

FIG. 7 generally illustrates the principle of color-borrowing of a pixel arrangement according to an embodiment of the present disclosure.

In this example, the first sub-pixels 101 are red sub-pixels, the second sub-pixels 102 are blue sub-pixels, and the third sub-pixels 103 are green sub-pixels. The area of the second sub-pixel 102 is the same as the area of the first sub-pixel 101, that is, the area of the red sub-pixel is the same as the area of the blue sub-pixel.

As shown in FIG. 7, the green sub-pixel G, the red sub-pixel R, and the blue sub-pixel B located at the vertices of each of the dashed triangles form a respective virtual pixel. Advantageously, there are always common sub-pixels between directly adjacent dashed triangles. This provides a higher virtual resolution than the physical resolution, which improves the display effect. Furthermore, the first sub-pixels 101, the second sub-pixels 102, and the third sub-pixels 103 are allowed to be arranged more closely as described above, thereby providing a larger area per sub-pixel than the existing pixel arrangement.

Figure 8:
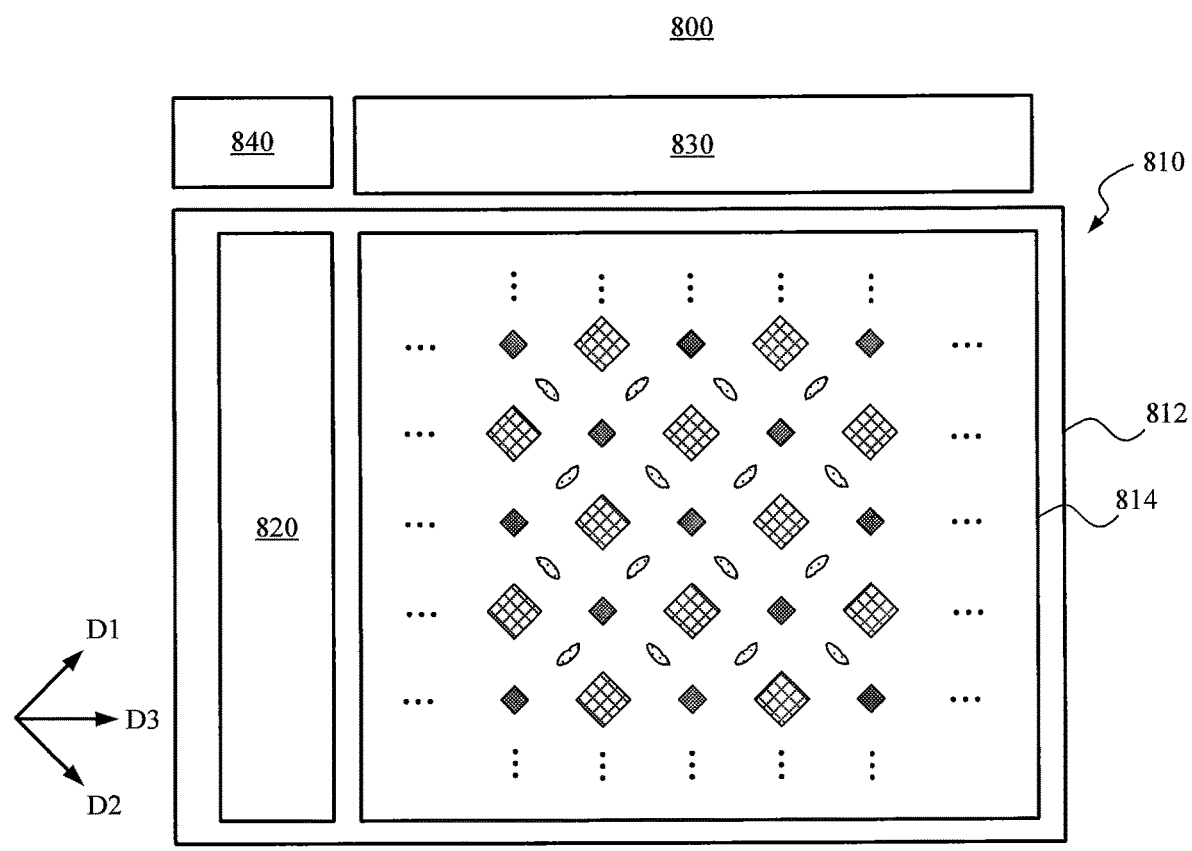
FIG. 8 is a schematic plan view of a display device according to an embodiment of the present disclosure.

FIG. 8 is a schematic plan view of a display device 800 according to an embodiment of the present disclosure.

Referring to FIG. 8, the display device 800 includes a display panel 810, a scan driver 820, a data driver 830, and a timing controller 840.

The display panel 810 includes a display substrate 812 and a pixel arrangement 814 formed on the display substrate 812. The pixel arrangement 814 may take the form of any of the pixel arrangement 100 and its various variations as described above with respect to FIGS. 1-7. The pixel arrangement 814 is arranged such that each of the first direction D1 and the second direction D2 (according to which the configurations of the pixel arrangement 100 and its various variations are described) intersects a length direction D3 of the display substrate 812 at approximately 45 degrees. The term approximately here is intended to cover a certain range of error, such as ±10%. For example, 40.5 degrees is considered approximately 45 degrees. The sub-pixels in the pixel arrangement 814 may be organic electroluminescence sub-pixels, although the disclosure is not limited thereto.

The scan driver 820 outputs gate scan signals to the display panel 810. In some exemplary embodiments, the scan driver 820 may be directly integrated in the display substrate 812 as a gate-driver-on-array (GOA) circuit. Alternatively, the scan driver 820 may be coupled to display panel 810 via a Tape Carrier Package (TCP). The implementation of the scan driver 820 may be known, and a detailed description thereof is thus omitted.

The data driver 830 outputs data voltages to the display panel 810. In some embodiments, the data driver 830 may include a plurality of data driving chips that operate in parallel. The implementation of the data driver 830 may be known, and a detailed description thereof is thus omitted.

The timing controller 840 controls the operations of the scan driver 820 and the data driver 830. Specifically, the timing controller 840 outputs data control signals and image data to control the driving operation of the data driver 830, and outputs gate control signals to control the driving operation of the scan driver 820. The data control signals and the image data are applied to the data driver 830. The gate control signals are applied to the scan driver 820. The implementation of the timing controller 840 may be known, and a detailed description thereof is thus omitted.

The display device 800 has the same advantages as the pixel arrangement embodiments described above with respect to FIGS. 1-7, which are not repeated herein. By way of example and not limitation, the display device 800 may be any product or component having a display function, such as a cell phone, a tablet, a television, a display, a notebook computer, a digital photo frame, a navigator, and the like.

Figure 9A:
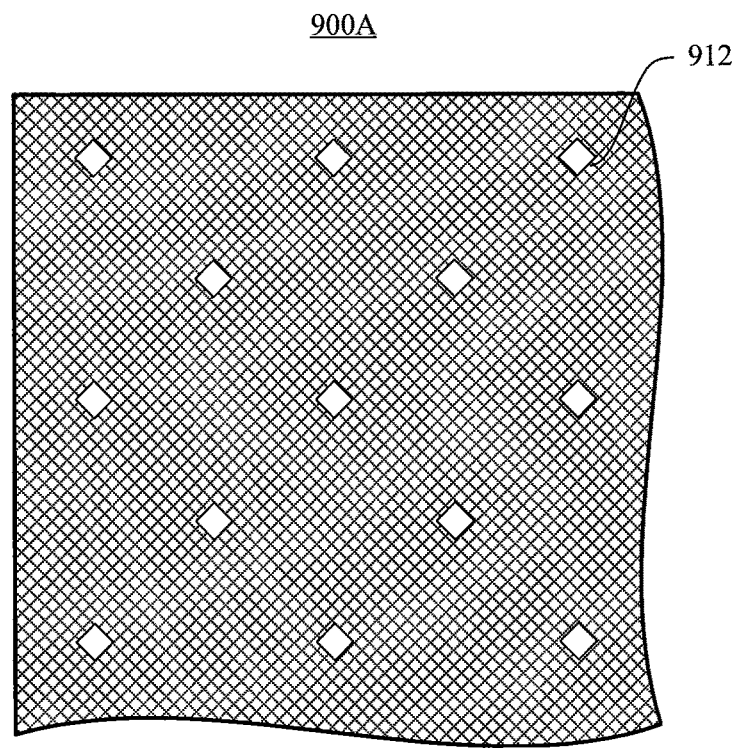
FIGS. 9A, 9B, and 9C are schematic plan views of a set of masks according to an embodiment of the present disclosure.
Figure 9B:
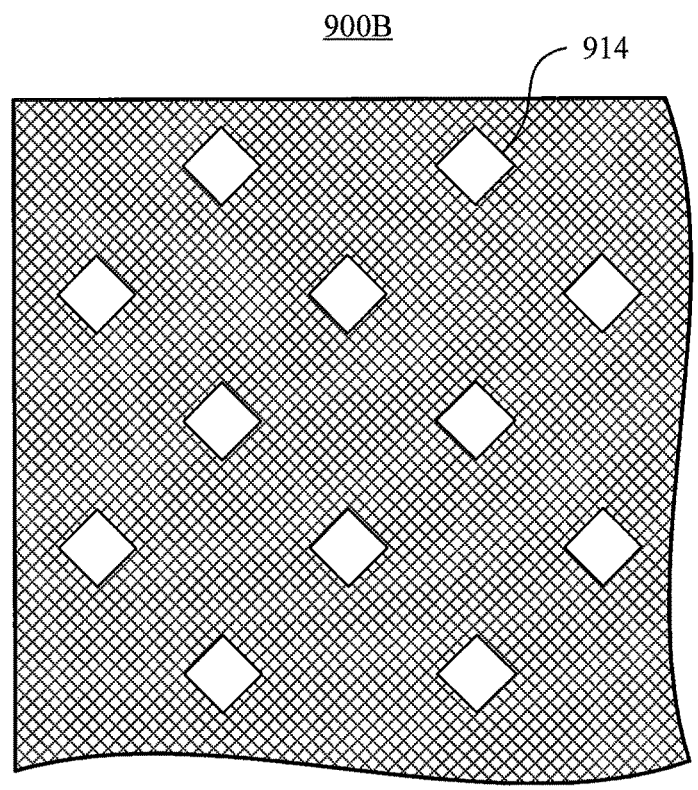
Figure 9C:
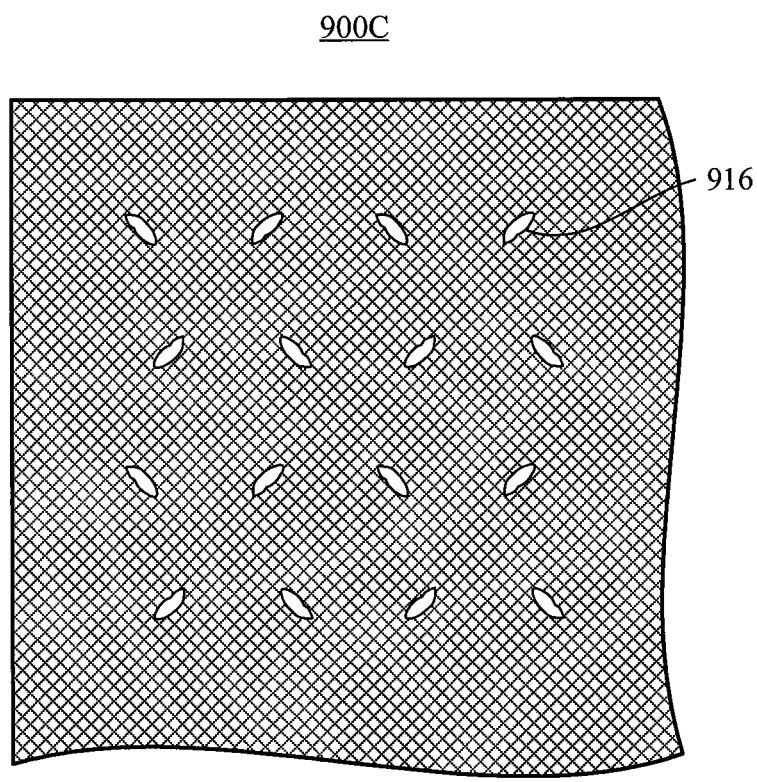

FIGS. 9A, 9B and 9C are schematic plan views of a set of masks in accordance with an embodiment of the present disclosure. The set of masks includes a first mask 900A, a second mask 900B, and a third mask 900C.

Referring to FIG. 9A, only part of the first mask 900A is shown. The first mask 900A defines a plurality of first openings 912. The plurality of first openings 912 are arranged to have a pattern corresponding to the pattern of the first sub-pixels of any of the pixel arrangement 100 or its various variations as described above with respect to FIGS. 1-7. In this example, the plurality of first openings 912 are arranged to have a pattern corresponding to the pattern of the first sub-pixels of the pixel arrangement 100 of FIG. 1. In some embodiments, the mask 900A is a fine metal mask that can be used in an evaporation process to form a desired pixel pattern.

Referring to FIG. 9B, only part of the second mask 900B is shown. The second mask 900B defines a plurality of second openings 914. The plurality of second openings 914 are arranged to have a pattern corresponding to the pattern of the second sub-pixels of any of the pixel arrangement 100 or its various variations as described above with respect to FIGS. 1-7. In this example, the plurality of second openings 914 are arranged to have a pattern corresponding to the pattern of the second sub-pixels of the pixel arrangement 100 of FIG. 1. In some embodiments, the mask 900B is a fine metal mask that can be used in an evaporation process to form a desired pixel pattern.

Referring to FIG. 9C, only part of the third mask 900C is shown. The third mask 900C defines a plurality of third openings 916. The plurality of third openings 916 are arranged to have a pattern corresponding to the pattern of the third sub-pixels of any of the pixel arrangement 100 or its various variations as described above with respect to FIGS. 1-7. In this example, the plurality of third openings 916 are arranged to have a pattern corresponding to the pattern of the third sub-pixels of the pixel arrangement 100 of FIG. 1. In some embodiments, the mask 900C is a fine metal mask that can be used in an evaporation process to form a desired pixel pattern.

The masks 900A, 900B, and 900C may provide the same advantages as the pixel arrangement embodiments described above with respect to FIGS. 1-7, which are not repeated here.

Figure 10:
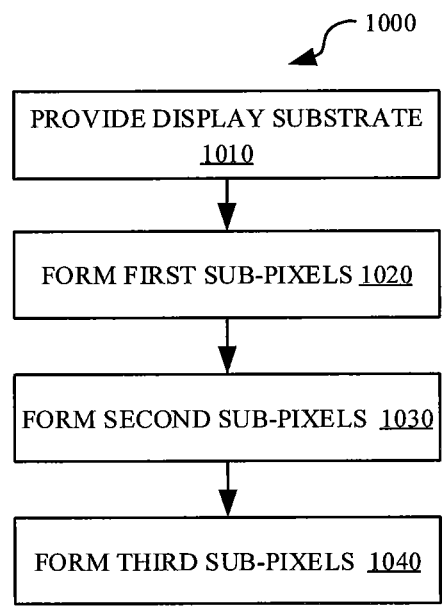
FIG. 10 is a flow chart of a method of manufacturing a pixel arrangement according to an embodiment of the present disclosure.

FIG. 10 is a flow chart of a method 1000 of manufacturing a pixel arrangement in accordance with an embodiment of the present disclosure. The pixel arrangement embodiments described above with respect to FIGS. 1-7 can be implemented using the method 1000 and the masks 900A, 900B, and 900C.

Referring to FIG. 10, at step 1010, a display substrate is provided. The display substrate is typically a back-plate that has been provided with driving circuits formed of, for example, thin film transistors (TFTs). At step 1020, a first electroluminescent material is evaporated and the evaporated first electroluminescence material is deposited onto the display substrate to form the first sub-pixels 101 by passing the evaporated first electroluminescent material through the plurality of first openings 912 of the first mask 900A. At step 1030, a second electroluminescent material is evaporated and the evaporated second electroluminescence material is deposited onto the display substrate to form the second sub-pixels 102 by passing the evaporated second electroluminescent material through the plurality of second openings 914 of the second mask 900B. At step 1040, a third electroluminescent material is evaporated and the evaporated third electroluminescence material is deposited onto the display substrate to form the third sub-pixels 103 by passing the evaporated third electroluminescent material through the plurality of third openings 916 of the third mask 900C. Steps 1020 to 1040 are generally referred to as evaporation, by which the pixel pattern can be formed at predetermined positions on the display substrate. It will be understood that steps 1020 to 1040 may be performed in an order different from that illustrated and described. In some embodiments, the electroluminescent materials may be organic electroluminescent materials. Other electroluminescent materials are possible.

Variations to the disclosed embodiments can be understood and effected by the skilled person in practicing the claimed subject matter, from a study of the drawings, the disclosure, and the appended claims. While operations are depicted in the drawings in a particular order, this should not be understood as requiring that such operations are to be performed in the particular order shown or in a sequential order, or that all illustrated operations are to be performed to achieve desirable results. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A pixel arrangement comprising:
a plurality of first groups of sub-pixels arranged in a first direction, each of the plurality of first groups comprising first ones of a plurality of first sub-pixels and first ones of a plurality of third sub-pixels arranged alternately; and
a plurality of second groups of sub-pixels arranged in the first direction, each of the plurality of second groups comprising second ones of the plurality of third sub-pixels and first ones of a plurality of second sub-pixels arranged alternately,
wherein the plurality of first groups and the plurality of second groups are alternately arranged in a second direction intersecting the first direction,
wherein the plurality of first groups and the plurality of second groups are arranged to form a plurality of third groups of sub-pixels arranged in the second direction and a plurality of fourth groups of sub-pixels arranged in the second direction,
wherein the plurality of third groups and the plurality of fourth groups are alternately arranged in the first direction,
wherein each of the plurality of third groups comprises second ones of the plurality of first sub-pixels and third ones of the plurality of third sub-pixels arranged alternately,
wherein each of the plurality of fourth groups comprises fourth ones of the plurality of third sub-pixels and second ones of the plurality of second sub-pixels arranged alternately, and
wherein the first ones and the second ones of the third sub-pixels in the plurality of first and second groups comprise at least one configuration selected from a group consisting of:
(i) each of the third sub-pixels in each first group of the plurality of first groups having a first minimum distance from one of two first sub-pixels, directly adjacent thereto, of the first sub-pixels in the first group and a second minimum distance from another of the two first sub-pixels, directly adjacent thereto, of the first sub-pixels in the first group, the first minimum distance being not equal to the second minimum distance; and (ii) each of the third sub-pixels in each second group of the plurality of second groups having a third minimum distance from one of two second sub-pixels, directly adjacent thereto, of the second sub-pixels in the second group and a fourth minimum distance from another of the two second sub-pixels, directly adjacent thereto, of the second sub-pixels in the second group, the third minimum distance being not equal to the fourth minimum distance.

2. The pixel arrangement of claim 1,
wherein each of the third sub-pixels in each third group of the plurality of third groups has the first minimum distance from one of two first sub-pixels, directly adjacent thereto, of the first sub-pixels in the third group and the second minimum distance from another of the two first sub-pixels, directly adjacent thereto, of the first sub-pixels in the third group; and/or
wherein each of the third sub-pixels in each fourth group of the plurality of fourth groups has the third minimum distance from one of two second sub-pixels, directly adjacent thereto, of the second sub-pixels in the fourth group and the fourth minimum distance from another of the two second sub-pixels, directly adjacent thereto, of the second sub-pixels in the fourth group.

3. The pixel arrangement of claim 2, wherein the first minimum distance is substantially equal to the third minimum distance.

4. The pixel arrangement of claim 2, wherein the second minimum distance is substantially equal to the fourth minimum distance.

5. The pixel arrangement of claim 1, wherein the third sub-pixels each have an irregular shape.

6. The pixel arrangement of claim 5, wherein the third sub-pixels each have substantially a same area.

7. The pixel arrangement of claim 5,
wherein the first ones of the plurality of third sub-pixels in each of the plurality of first groups each have a length direction substantially parallel to the first direction, and
wherein the second ones of the plurality of third sub-pixels in each of the plurality of second groups each have a length direction substantially parallel to the second direction.

8. The pixel arrangement of claim 5,
wherein two adjacent ones of the third sub-pixels in each of the plurality of first groups are rotationally symmetric with respect to a midpoint of an imaginary line connecting geometric centers of the two adjacent ones of the third sub-pixels, and
wherein two adjacent ones of the third sub-pixels in each of the plurality of third groups are rotationally symmetric with respect to a midpoint of an imaginary line connecting geometric centers of the two adjacent ones of the third sub-pixels.

9. The pixel arrangement of claim 1, wherein the first sub-pixels and the second sub-pixels each have a regular shape.

10. The pixel arrangement of claim 9, wherein first ones of the first sub-pixels each have a first shape and second ones of the first sub-pixels each have a second shape that is different from the first shape.

11. The pixel arrangement of claim 9, wherein first ones of the second sub-pixels each have a first shape and second ones of the second sub-pixels each have a second shape that is different from the first shape.

12. The pixel arrangement of claim 9,
wherein the first sub-pixels each have substantially a same first area, and
wherein the second sub-pixels each have substantially a same second area.

13. The pixel arrangement of claim 1,
wherein the first sub-pixels comprise red sub-pixels,
wherein the second sub-pixels comprise blue sub-pixels, and
wherein the third sub-pixels comprise green sub-pixels.

14. The pixel arrangement of claim 1,
wherein the first sub-pixels comprise blue sub-pixels,
wherein the second sub-pixels comprise red sub-pixels, and
wherein the third sub-pixels comprise green sub-pixels.

15. The pixel arrangement of claim 13 or 14,
wherein the first sub-pixels each have a first area,
wherein the second sub-pixels each have a second area, and
wherein the third sub-pixels each have a third area that is smaller than the first area and smaller than the second area.

16. A display panel comprising:
a display substrate; and
a pixel arrangement on the display substrate, wherein the pixel arrangement comprises:
a plurality of first groups of sub-pixels arranged in a first direction, each of the plurality of first groups comprising first ones of a plurality of first sub-pixels and first ones of a plurality of third sub-pixels arranged alternately; and
a plurality of second groups of sub-pixels arranged in the first direction, each of the plurality of second groups comprising second ones of the plurality of third sub-pixels and first ones of a plurality of second sub-pixels arranged alternately,
wherein the plurality of first groups and the plurality of second groups are alternately arranged in a second direction intersecting the first direction,
wherein the plurality of first groups and the plurality of second groups are arranged to form a plurality of third groups of sub-pixels arranged in the second direction and a plurality of fourth groups of sub-pixels arranged in the second direction,
wherein the plurality of third groups and the plurality of fourth groups are alternately arranged in the first direction,
wherein each of the plurality of third groups comprises second ones of the plurality of first sub-pixels and third ones of the plurality of third sub-pixels arranged alternately,
wherein each of the plurality of fourth groups comprises fourth ones of the plurality of third sub-pixels and second ones of the plurality of second sub-pixels arranged alternately, and
wherein the first ones and the second ones of the third sub-pixels in the plurality of first and second groups comprise at least one configuration selected from a group consisting of:
(i) each of the third sub-pixels in each first group of the plurality of first groups having a first minimum distance from one of two first sub-pixels, directly adjacent thereto, of the first sub-pixels in the first group and a second minimum distance from another of the two first sub-pixels, directly adjacent thereto, of the first sub-pixels in the first group, the first minimum distance being not equal to the second minimum distance; and (ii) each of the third sub-pixels in each second group of the plurality of second groups having a third minimum distance from one of two second sub-pixels, directly adjacent thereto, of the second sub-pixels in the second group and a fourth minimum distance from another of the two second sub-pixels, directly adjacent thereto, of the second sub-pixels in the second group, the third minimum distance being not equal to the fourth minimum distance, and wherein the pixel arrangement is arranged such that each of the first direction and the second direction intersects a length direction of the display substrate at approximately 45 degrees.

17. The display panel of claim 16, wherein the first sub-pixels, the second sub-pixels, and the third sub-pixels comprise organic electroluminescent sub-pixels.

18. A display device comprising the display panel of claim 16.

19. A set of masks for manufacturing a pixel arrangement, wherein the pixel arrangement comprises:
  a plurality of first groups of sub-pixels arranged in a first direction, each of the plurality of first groups comprising a plurality of first sub-pixels and a plurality of third sub-pixels arranged alternately; and
  a plurality of second groups of sub-pixels arranged in the first direction, each of the plurality of second groups comprising a plurality of third sub-pixels and a plurality of second sub-pixels arranged alternately,
  wherein the plurality of first groups and the plurality of second groups are alternately arranged in a second direction intersecting the first direction,
  wherein the plurality of first groups and the plurality of second groups are arranged to form a plurality of third groups of sub-pixels arranged in the second direction and a plurality of fourth groups of sub-pixels arranged in the second direction, the plurality of third groups and the plurality of fourth groups are alternately arranged in the first direction, each of the plurality of third groups comprises a plurality of first sub-pixels and a plurality of third sub-pixels arranged alternately, and each of the plurality of fourth groups comprises a plurality of third sub-pixels and a plurality of second sub-pixels arranged alternately, and
  wherein the third sub-pixels in the plurality of first and second groups comprise at least one configuration selected from a group consisting of: (i) each of the third sub-pixels in each first group of the plurality of first groups having a first minimum distance from one of two first sub-pixels, directly adjacent thereto, of the first sub-pixels in the first group and a second minimum distance from another of the two first sub-pixels, directly adjacent thereto, of the first sub-pixels in the first group, the first minimum distance being not equal to the second minimum distance; and (ii) each of the third sub-pixels in each second group of the plurality of second groups having a third minimum distance from one of two second sub-pixels, directly adjacent thereto, of the second sub-pixels in the second group and a fourth minimum distance from another of the two second sub-pixels, directly adjacent thereto, of the second sub-pixels in the second group, the third minimum distance being not equal to the fourth minimum distance,
  wherein the set of masks comprises:
  a first mask defining a plurality of first openings arranged to have a pattern corresponding to a pattern of the first sub-pixels;
  a second mask defining a plurality of second openings arranged to have a pattern corresponding to a pattern of the second sub-pixels; and
  a third mask defining a plurality of third openings arranged to have a pattern corresponding to a pattern of the third sub-pixels.

20. A method of manufacturing a pixel arrangement using the set of masks of claim 19, comprising:
  providing a display substrate;
  evaporating a first electroluminescent material and depositing the first electroluminescent material that was evaporated onto the display substrate to form the first sub-pixels by passing the first electroluminescent material that was evaporated through the plurality of first openings of the first mask;
  evaporating a second electroluminescent material and depositing the second electroluminescent material that was evaporated onto the display substrate to form the second sub-pixels by passing the second electroluminescent material that was evaporated through the plurality of second openings of the second mask; and
  evaporating a third electroluminescent material and depositing the third electroluminescent material that was evaporated onto the display substrate to form the third sub-pixels by passing the third electroluminescent material that was evaporated through the plurality of third openings of the third mask.

* * * * *